United States Patent
Takama et al.

(10) Patent No.: US 11,272,651 B2
(45) Date of Patent: Mar. 8, 2022

(54) COMPONENT MOUNTING DEVICE, METHOD OF CAPTURING IMAGE, AND METHOD OF DETERMINING MOUNTING SEQUENCE

(71) Applicant: YAMAHA HATSUDOKI KABUSHIKI KAISHA, Iwata (JP)

(72) Inventors: Kazushi Takama, Iwata (JP); Kunimune Komaike, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 85 days.

(21) Appl. No.: 16/650,737

(22) PCT Filed: Sep. 28, 2017

(86) PCT No.: PCT/JP2017/035228
§ 371 (c)(1),
(2) Date: Mar. 25, 2020

(87) PCT Pub. No.: WO2019/064428
PCT Pub. Date: Apr. 4, 2019

(65) Prior Publication Data
US 2021/0029857 A1    Jan. 28, 2021

(51) Int. Cl.
*H05K 13/08*      (2006.01)
*H04N 13/204*     (2018.01)
(Continued)

(52) U.S. Cl.
CPC ....... *H05K 13/0882* (2018.08); *G06T 7/0004* (2013.01); *H04N 5/23299* (2018.08);
(Continued)

(58) Field of Classification Search
CPC ........ G06T 7/0004; G06T 2207/30141; H04N 5/23299; H04N 13/0408; H04N 13/0812; H04N 13/0815; H04N 13/204
See application file for complete search history.

(56) References Cited

U.S. PATENT DOCUMENTS 5,541,834 A * 7/1996 Tomigashi et al. .......................... H05K 13/0812
29/833
6,317,972 B1 * 11/2001 Asai .................. H05K 13/0812
29/833
(Continued)

FOREIGN PATENT DOCUMENTS

| CN | 106233832 A | 12/2016 |
|----|-------------|---------|
| JP | 2002-118360 A | 4/2002 |

(Continued)

OTHER PUBLICATIONS

International Search Report issued in PCT/JP2017/035228; dated Oct. 24, 2017.
(Continued)

*Primary Examiner* — Carl J Arbes
(74) *Attorney, Agent, or Firm* — Studebaker & Brackett PC

(57) ABSTRACT

A component mounting device for mounting a component on a substrate includes a head unit, a driver to move the head unit on a stage, and a controller. The head unit includes a mounting head to hold the component and a stereo camera to capture a three-dimensional image of an object. The controller performs image capturing, calculating and mounting processes. The image capturing captures an image of a relevant area including a mounting point on the substrate by the stereo cameras before the component reaches the mounting point. The calculating calculates a correction amount with respect to X, Y and Z axes directions based on
(Continued)

three-dimensional information on the relevant area with respect to the directions obtained in the image capturing process to mount the component on lands corresponding to the mounting point. The mounting includes correcting the mounting point based on the correction amount and mounting the component.

8 Claims, 17 Drawing Sheets

(51) Int. Cl.
    *H04N 5/232*     (2006.01)
    *G06T 7/00*     (2017.01)
    *H05K 13/04*     (2006.01)

(52) U.S. Cl.
    CPC ....... *H04N 13/204* (2018.05); *H05K 13/0408* (2013.01); *H05K 13/0812* (2018.08); *H05K 13/0815* (2018.08); *G06T 2207/30141* (2013.01)

(56) References Cited

U.S. PATENT DOCUMENTS

| | | | |
|---|---|---|---|
| 10,420,267 B2 * | 9/2019 | Kanai | ................ H05K 13/0408 |
| 2001/0055069 A1 * | 12/2001 | Hudson | .............. H05K 13/0812 348/302 |
| 2017/0049013 A1 | 2/2017 | Kanai et al. | |

FOREIGN PATENT DOCUMENTS

| | | | |
|---|---|---|---|
| JP | 339213 B | * | 10/2002 |
| JP | 2014-216621 A | | 11/2014 |
| JP | 2015090925 A | * | 5/2015 |
| JP | 2015-211187 A | | 11/2015 |
| JP | 2015-213139 A | | 11/2015 |
| JP | 2015213139 A | * | 11/2015 |
| JP | 2017-050496 A | | 3/2017 |
| WO | 2016/203638 | * | 12/2016 |

OTHER PUBLICATIONS

An Office Action mailed by China National Intellectual Property Administration dated Aug. 27, 2020, which corresponds to Chinese Patent Application No. 201780094758.8 and is related to U.S. Appl. No. 16/650,737 with English language translation.

An Office Action mailed by China National Intellectual Property Administration dated Apr. 25, 2021 which corresponds to Chinese Patent Application No. 201780094758.8 and is related to U.S. Appl. No. 16/650,737 with English language translation.

An Office Action; "Notice of Reasons for Refusal," mailed by the Japanese Patent Office dated Jan. 19, 2021, which corresponds to Japanese Patent Application No. 2019-545490 and is related to U.S. Appl. No. 16/650,737 ; with English language translation.

* cited by examiner

COMPONENT MOUNTING DEVICE, METHOD OF CAPTURING IMAGE, AND METHOD OF DETERMINING MOUNTING SEQUENCE

CROSS-REFERENCE TO RELATED APPLICATION

This application is a National Stage of International Patent Application No. PCT/JP2017/035228, filed Sep. 28, 2017, the entire content of which is incorporated herein by reference.

BACKGROUND

Technical Field:

The technology disclosed herein relates to a component mounting device, a method of capturing an image, and a method of determining a mounting sequence.

Background Art:

Component mounting devices are devices for mounting components on printed circuit boards using mounting heads. In Japanese Unexamined Patent Application Publication No. 2014-216621, a camera module is mounted on a mounting head. The camera module measures a three-dimensional position of a pattern of component mounting position with a chucking nozzle directly above the component mounting position. The position of the mounting head is corrected based on a result of the pattern measurement by the camera module to improve accuracy in mounting of the components.

SUMMARY

An image of the pattern is captured with the chucking nozzle directly above the component mounting position. Time for capturing the pattern and time for calculating a correction amount based on the result of the measurement are required. This may increase downtime.

The technology described herein was made in view of the foregoing circumstances, to improve accuracy in mounting of components and reduce downtime.

A component mounting device for mounting a component on a substrate includes a head unit, a driver configured to move the head unit on a stage, and a controller. The head unit includes a mounting head and a stereo camera. The mounting head is configured to hold the component. The stereo camera is configured to capture a three-dimensional image of an object. The controller is configured to perform an image capturing process, a calculating process, and a mounting process. The image capturing process includes capturing an image of a relevant area including a mounting point on the substrate by the stereo camera before the component reaches the mounting point during a transfer of the component held by the mounting head to the mounting point. The calculating process includes calculating a correction amount with respect to an X-axis direction, a Y-axis direction, and a Z-axis direction based on three-dimensional information on the relevant area with respect to the X-axis direction, the Y-axis direction, and the Y-axis direction obtained in the image capturing process to mount the component on a solder on a land corresponding to the mounting point. The mounting process includes correcting the mounting point of the component based on the correction amount and mounting the component on the substrate.

An example of the component mounting device may include the controller that is configured to perform error processing if the correction amount is out of a tolerance. According to the configuration, a failure is less likely to occur.

A method of capturing an image of a relevant area including a mounting point at which a component held by a mounting head in a head unit is to be mounted by a stereo camera in the head unit includes: moving a head unit so that a section of a field of view of the stereo camera in which the component is not present overlaps the relevant area including the mounting point in advance; and capturing an image of the relevant area including the mounting point at which the component is to be mounted by the stereo camera before mounting of the component to correct the mounting point of the component.

A method of capturing an image of a relevant area including a mounting point at which a component held by a mounting head in a head unit is to be mounted by a stereo camera in the head unit includes: moving a head unit so that a section of a field of view of the stereo camera in which the component is not present overlaps the relevant area including the mounting point in advance; and capturing an image of the relevant area including the mounting point at which the component is to be mounted by the stereo camera before mounting of the component to correct the mounting point of the component. According to the method, the section of the field of view of the stereo camera in which the component is not present overlaps the relevant area, which is a target of the image capturing, before a section of the field of view in which the component is present. Therefore, the image of the relevant area can be captured at the time when the relevant area M, which is the target of the image capturing, overlaps the field of view of the stereo camera. Namely, the image of the relevant area can be captured without a loss of time.

A method of determining a mounting sequence in a component mounting device including a head unit including mounting heads and stereo cameras includes determining the mounting sequence of mounting components so that the components are held by the mounting heads in the head unit at a time, one of the components is mounted at a mounting point, a section of a field of view of each of the stereo cameras in which the component is not present overlaps a relevant area including a next mounting point in advance during transfer of next one of the components to the next mounting point. According to the method, the section of the field of view of each of the stereo cameras in which the component is not present overlaps the relevant area, which is a target of the image capturing, before a section of the field of view in which the component is present. Therefore, the image of the relevant area can be captured at the time when the relevant area M, which is the target of the image capturing, overlaps the field of view of the stereo camera. Namely, the image of the relevant area can be captured without a loss of time.

According to the technology described herein, accuracy in mounting of components improves and downtime decreases.

DETAILED DESCRIPTION

First Embodiment

1. Description of Component Mounting Device

A first embodiment of the present disclosure will be described with reference to FIGS. 1 to 14.

Figure 1:
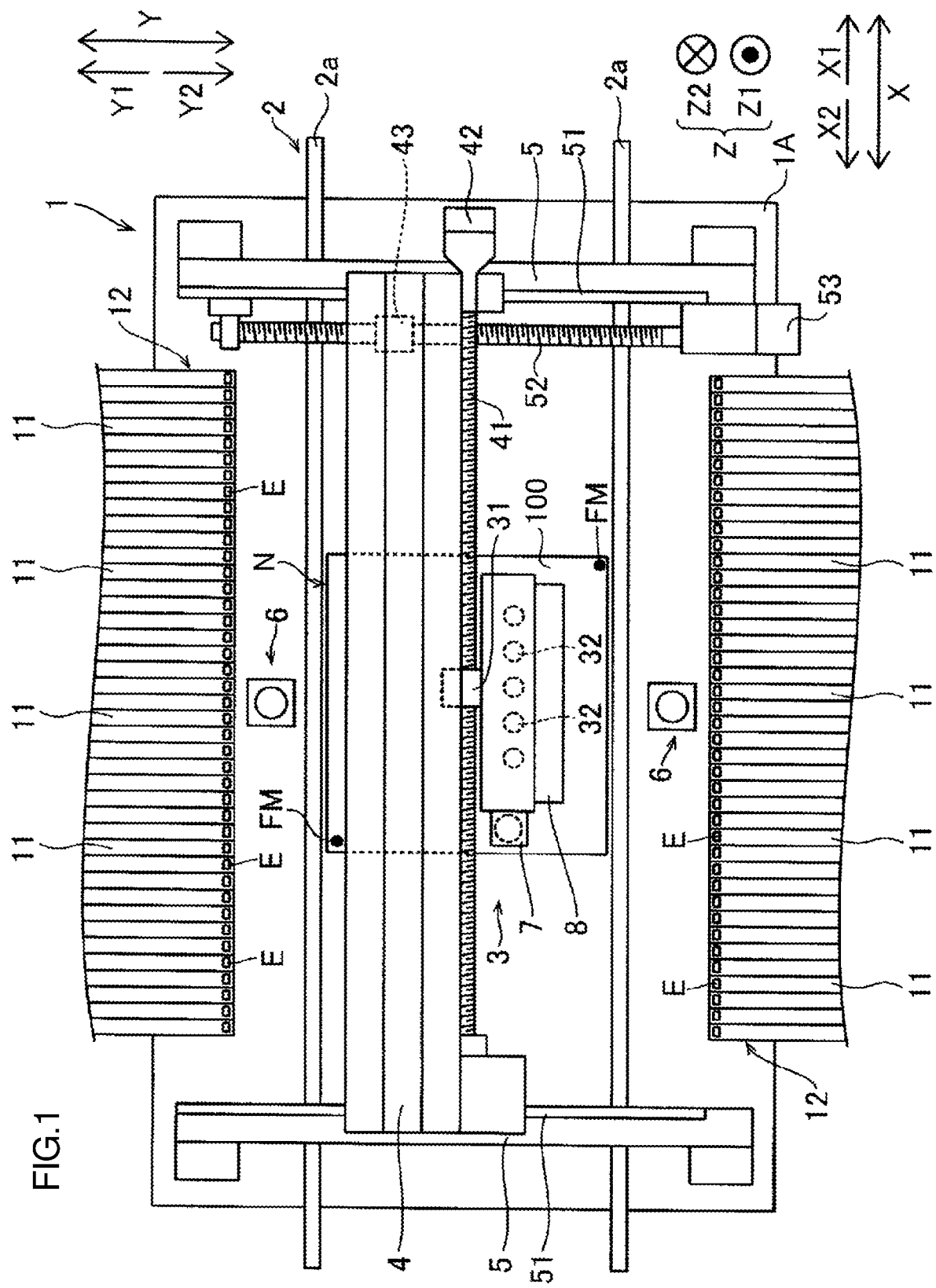
FIG. 1 is a plan view of a component mounting device according to a first embodiment.

A component mounting device 1 is a device for mounting components including ICs, transistors, capacitors, and resistors on a substrate 100, which may be a printed circuit board, as illustrated in FIG. 1.

The component mounting device 1 includes a stage 1A, a transfer mechanism 2, a head unit 3, a support 4, rails 5, component recognition camera 6, a substrate recognition camera 7, an image capture unit 8, a controller 9, and a display 64.

At ends of the stage 1A in the Y-axis direction (on a Y1 side and a Y2 side), feeder setting portions 12 at which tape feeders 11 are disposed.

The tape feeders 11 hold reels (not illustrated) on which tapes are wound, respectively. Each of the tapes holds components E disposed at predefined intervals. Each of the tape feeders 11 is configured to release the components E at an end of the tape feeder 11 by rotating the reel to feed the tape that holds the components E.

The tape feeders 11 are disposed in the respective feeder setting portions 12 and electrically connected to the controller 9 via connectors, which are not illustrated, provided in the feeder setting portions 12. Each of the tape feeders 11 is configured to feed the tape from the reel based on a control signal from the controller 9 to release the component E. Each of the tape feeders 11 is configured to release the component E in response to a mounting operation by the head unit 3.

The transfer mechanism 2 includes two conveyers 2a. The transfer mechanism 2 has a function to transfer the substrate 100 in a horizontal direction (the X-axis direction) with the conveyers 2a. Specifically, the transfer mechanism 2 receives the substrate 100, on which the components are not mounted, from a transfer path on an upper-stream side (on an X1 side), transfers the received substrate 100 to a mounting operation point N, and ejects the substrate 100 to a transfer path on a down-stream side (on an X2 side) after the mounting of the components is completed. The transfer mechanism 2 holds and fixes the substrate 100 that is stopped at the mounting operation point N with a substrate fixing mechanism such as a clamp mechanism, which is not illustrated.

The conveyers 2a of the transfer mechanism 2 hold the substrate 100 from below and transfer the substrate 100 in the horizontal direction (the X-axis direction). A distance between the conveyers 2a in the Y-axis direction is adjustable. The distance between the conveyers 2a in the Y-axis can be adjusted according to a size of the substrate 100 delivered into the transfer mechanism 2.

Figure 2:
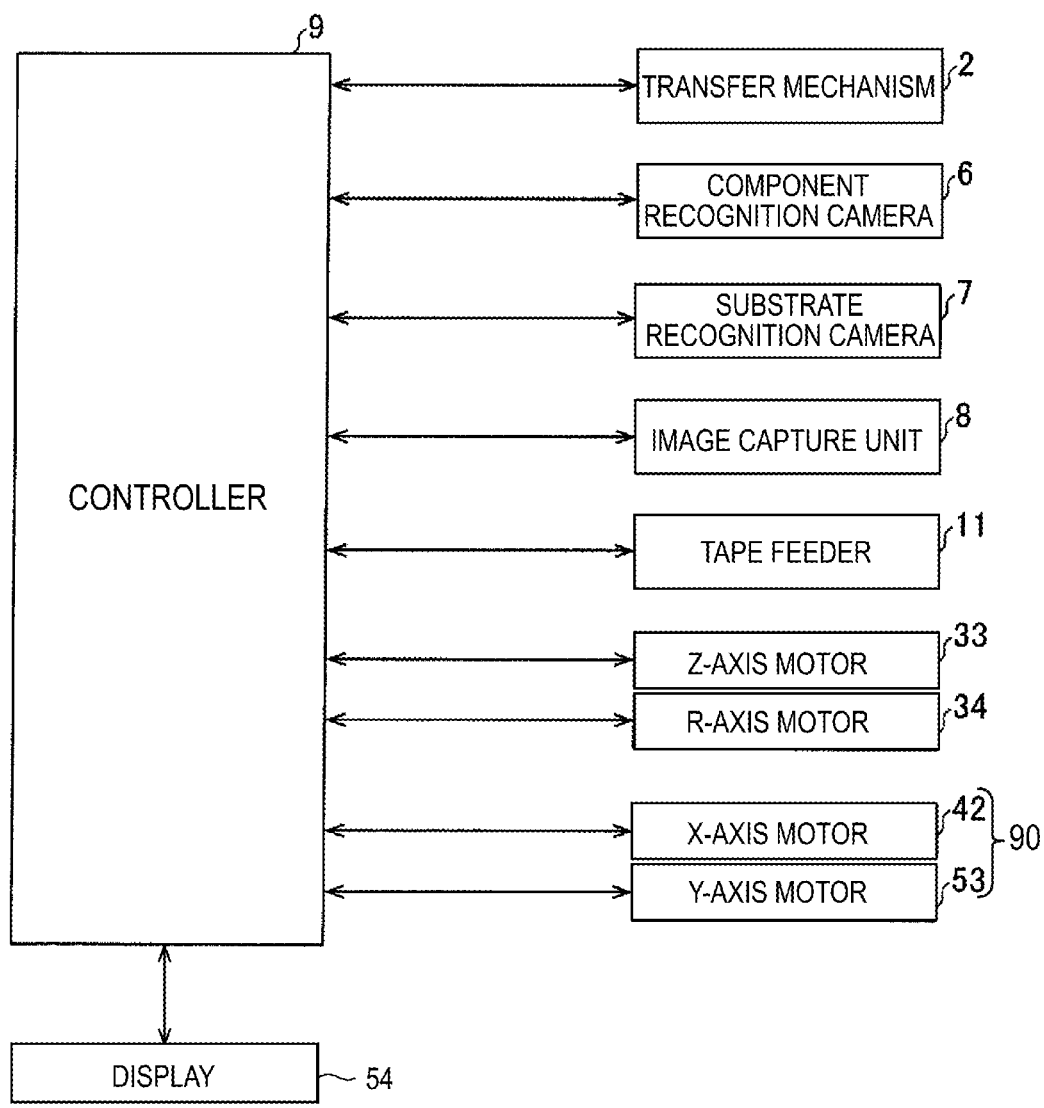
FIG. 2 is a block diagram illustrating an electrical configuration of the component mounting device.
Figure 3:
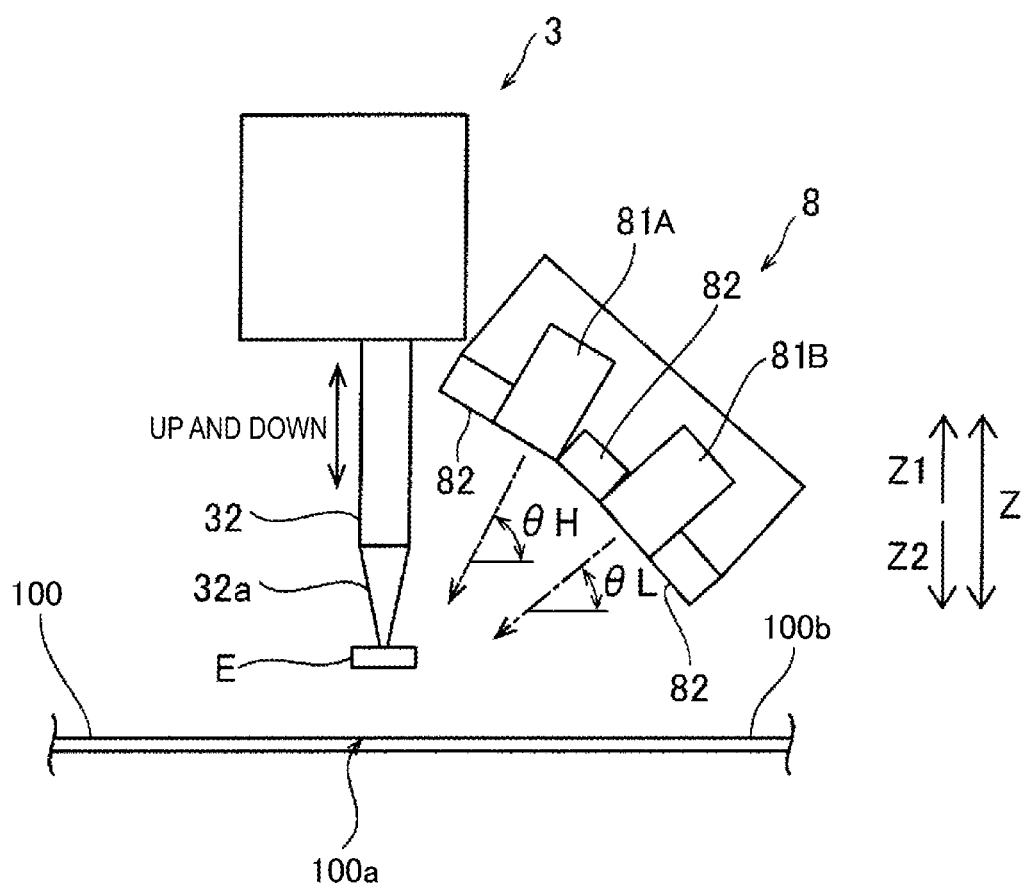
FIG. 3 is a side view of an image capture unit.

The head unit 3 is configured to mount the component E on the substrate 100 at a mounting position 100a (see FIG. 3). The substrate 100 is fixed at the mounting operation point N. The head unit 3 includes a ball nut 31, five mounting heads 32, five Z-axis motors 33 (see FIG. 2), and five R-axis motors 34 (see FIG. 2). The Z-axis motors 33 are disposed at the mounting heads 32, respectively. The R-axis motors 34 are disposed at the mounting heads 32, respectively.

The mounting heads 32 are arranged in line along the X-axis direction on a lower surface of the head unit 3. Nozzles 32a (see FIG. 3) are mounted to ends of the mounting heads 32, respectively. The mounting heads 32 are configured to suck and hold the components E with negative pressures generated at ends of the nozzles 32a by a negative pressure generator, which is not illustrated. The components E are released from the tape feeders 11.

The mounting heads 32 are configured to move up and down in the vertical direction (the Z-axis direction). Specifically, each of the mounting heads 32 is configured to move up and down between a lower position at which suction and mounting of the component E are performed and an upper position at which transfer and image capture of the component E are performed. In the head unit 3, the mounting heads 32 are independently movable by the Z-axis motors 33 provided for the mounting heads 32, respectively. Each of the mounting heads 32 is configured to rotate about the center axis of the nozzle 32a at the corresponding mounting head 32 by the corresponding R-axis motor 34 (about the Z-axis).

The head unit 3 is movable along the support 4 in the X-axis direction. Specifically, the support 4 includes a ball screw 41, an X-axis motor 42, and a guiderail, which is not illustrated. The X-axis motor 42 rotates the ball screw 41. The guiderail extends in the X-axis direction. The head unit 3 is movable together with the ball nut 31 along the support 4 in the X-axis direction when the ball screw 41 is rotated by the X-axis motor 42 and the ball screw 41 is engaged with (screwed into) the ball nut 31.

The support 4 is movable along the rails 5 fixed to the stage 1A in the Y-axis direction perpendicular to the X-axis direction. Specifically, the rails 5 include two guiderails 51, a ball screw 52, and a Y-axis motor 53. The guiderails 51 hold ends of the support 4 in the Y-axis direction to be movable in the Y-axis direction. The ball screw 52 extends in the Y-axis direction. The Y-axis motor 53 rotates the ball screw 52. A ball nut 43 with which the ball screw 52 is engaged (or into which the ball screw 52 is screwed) is provided at the support 4. The support 4 is movable together with the ball nut 43 with which the ball screw 52 is engaged (or into which the ball screw 52 is screwed) along the rails 5 in the Y-axis direction when the ball screw 52 is rotated by the Y-axis motor 53. The X-axis motor 42 and the Y-axis motor 53 are included in a driver 90 of the head unit 3.

According to the configuration, the head unit 3 is movable in the horizontal direction (the X-axis direction and the Y-axis direction) on the stage 1A. Therefore, the head unit 3 can move to a point above the tape feeder 11 and suck the component E released from the tape feeder 11. The head unit 3 can move to a point above the substrate 100 fixed at the mounting operation point N and mount the sucked component E on the substrate 100. Specifically, the head unit 3 can mount the component E on the pattern on the substrate 100.

The component recognition camera 6 is configured to capture an image of the component E sucked by the mounting head 32 for recognition of a sucked condition of the component E before mounting of the component E. The component recognition camera 6 is fixed to the top surface of the stage 1A and configured to capture the image of the component E sucked by the mounting head 32 from below (the Z2 direction). A captured image is obtained by the controller 9. The sucked condition of the component E (a rotated position and a sucked position relative to the mounting head 32) is determined by the controller 9 based on the captured image of the sucked component E.

The substrate recognition camera 7 is configured to capture images of position recognition marks (fiducial marks) FM on the substrate 100 prior to the mounting of the component E. The position recognition marks FM are for locating the substrate 100. In FIG. 1, two position recognition marks FM are at a lower right corner and an upper left corner of the substrate 100, respectively. Captured images of the position recognition marks FM are obtained by the controller 9. A location and a position of the substrate 100 fixed by a substrate fixing mechanism, which is not illustrated, are accurately determined based on the captured images of the position recognition marks FM.

The substrate recognition camera 7 is mounted on a side of the head unit 3 on the X2 side and movable together with the head unit 3 in the X-axis direction and the Y-axis direction on the stage 1A. The substrate recognition camera 7 moves in the horizontal direction (in the X-axis direction and the Y-axis direction) on the stage 1A to capture the images of the position recognition marks FM on the substrate 100 from above.

As illustrated in FIG. 1, the image capture unit 8 is mounted on a side of the head unit 3 on the Y2 side. The image capture unit 8 is movable together with the head unit 3 in the horizontal direction (the X-axis direction and the Y-axis direction) on the stage 1A.

The image capture unit 8 is provided for capturing an image of a solder applied to a pattern to mount the component E. Specifically, the image capture unit 8 is provided for determining X and Y coordinates of a solder S applied to the pattern on the substrate 100. A height is determined by stereo matching.

As illustrated in FIG. 3, the image capture unit 8 includes two measurement cameras 81A and 81B and three light units 82. The measurement cameras 81A and 81B and the light units 82 are provided for each mounting head 32.

As illustrated in FIG. 3, the measurement cameras 81A and 81B are configured to capture images of a specific area of the substrate 100 from different image capturing directions. Specifically, the measurement camera 81A disposed on an upper side (on the Z1 side) is configured to capture and image of the specific area of the substrate 100 from the image capturing direction that is angled to the horizontal plane (a plate substantially parallel to a substrate surface Pb on which the component E is mounted) with an angle θH (0°<θH<90°). The measurement camera 81B disposed on a lower side (on the Z2 side) is configured to the specific area of the substrate 100 from the image capturing direction that is angled to the horizontal plane (the plate substantially parallel to the substrate surface Pb on which the component E is mounted) with an angle θL (0°<θL<θH).

Figure 4:
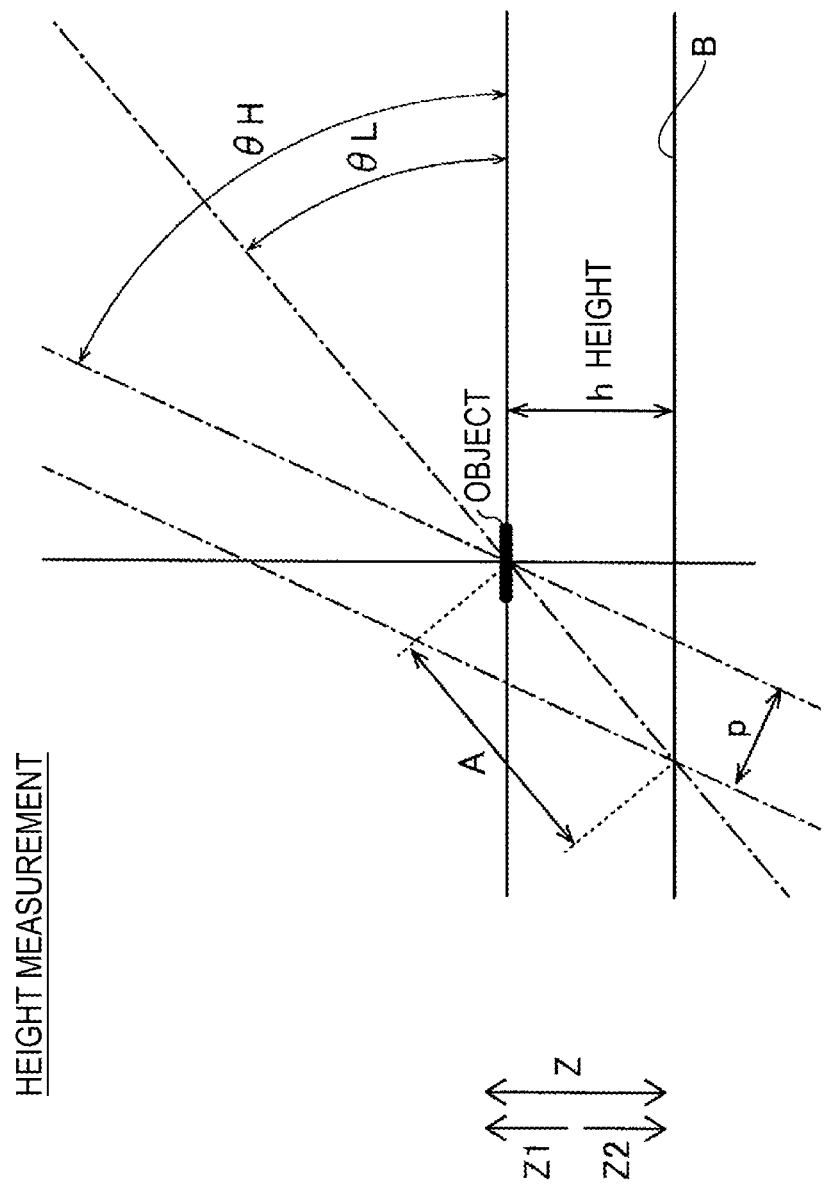
FIG. 4 is an explanatory view illustrating a method of measuring a height by stereo matching.

As illustrated in FIG. 4, the measurement camera 81A and 81B capture the images of the specific area of the substrate 100 from the image capturing direction with the angle θH and the image capturing direction with the angle θL at the same time. A parallax difference p (pixel) between the image captured from the image capturing direction with the angle θH and the image captured from the image capturing direction with the angle θL is calculated by stereo matching. If a camera resolution of the measurement cameras 81A and 81B is R (μm/pixel), a distance A (μm) is expressed by equation (1).

$$A = p \times R / \sin(\theta H - \theta L) \qquad (1)$$

A height h (μm) is expressed by equation (2) using distance A expressed by equation (1).

$$h = A \times \sin(\theta L) \qquad (2)$$

The measurement cameras 81A and 81 are stereo cameras configured to obtain depth information (Z-axis direction information) in addition to a two-dimensional image (a two-dimensional image in the X-axis direction and the Y-axis direction) of an object. Namely, the measurement cameras 81A and 81 are the stereo cameras configured to capture a three-dimensional image of the object.

In this example, a two-dimensional image of the solder S and a height Hs of the solder S relative to a reference plane B are obtained by the measurement cameras 81A and 81B. An example of the reference plane B may be the top plate surface 100b (the surface on which the components are mounted) of the substrate 100.

The light units 82 are disposed adjacent to the measurement cameras 81A and 81B and configured to emit light during the image capturing by the measurement cameras 81A and 81B. The light units 82 include light sources such as light emitting diodes (LEDs).

As illustrate in FIG. 2, the controller 9 includes a central processing unit (CPU), a read only memory (ROM), and a random access memory (RAM). The controller 9 is configured to control operations of the component mounting device 1. Specifically, the controller 9 is configured to control the transfer mechanism 2, the X-axis motor 42, the Y-axis motor 53, and the Z-axis motor 33 according to a pre-stored mounting program to mount the component E on the substrate 100.

2. Correction of Mounting Point Pm

Figure 5:
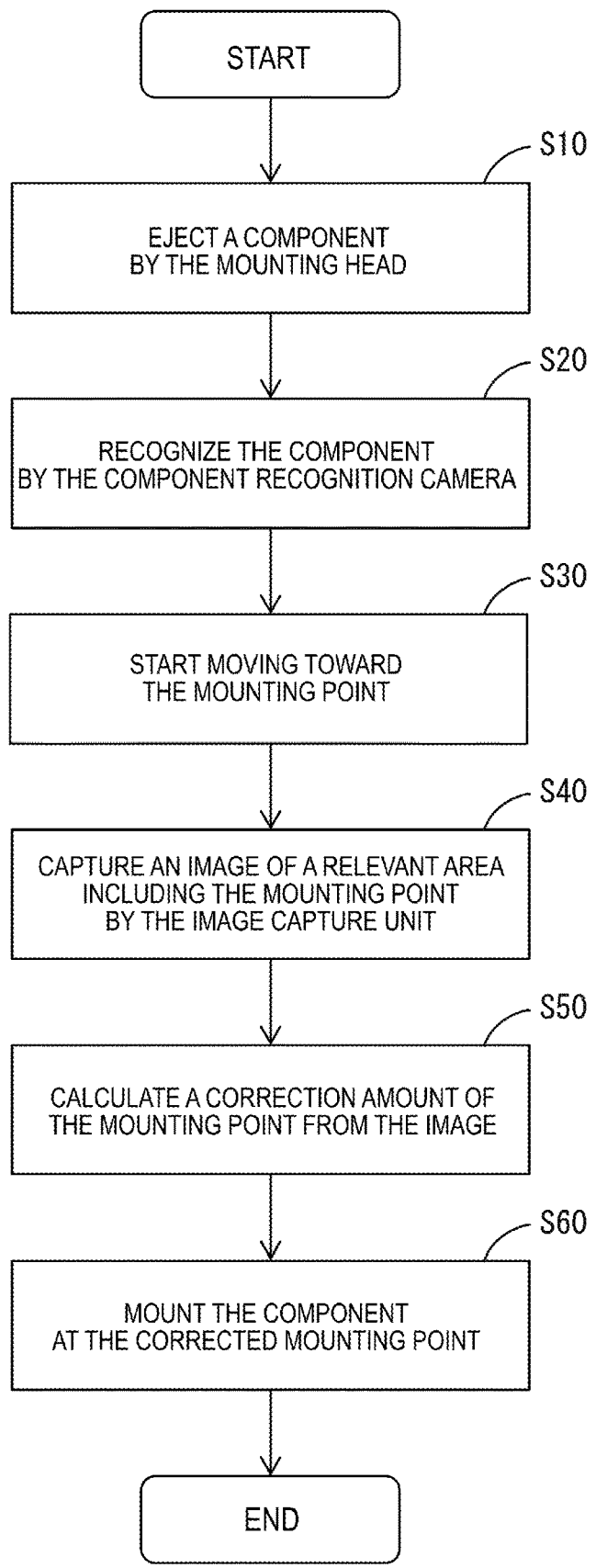
FIG. 5 is a flowchart illustrating a flow of a process of mounting a component on a substrate.

A flowchart in FIG. 5 illustrates a flow of mounting of the component E on the substrate 100.

The controller 9 controls the head unit 3 to move to the point above the tape feeder 11 and to hold the component E supplied by the tape feeder 11 by the mounting head 32 with vacuum (S10).

Then, the controller 9 controls the head unit 3 to move from the point above the tape feeder 11 to the point above the component recognition camera 6. The image of the component E sucked in step S10 is captured by the component recognition camera 6 and recognized (S20). From the image captured by the component recognition camera 6, a displacement of the component E from the mounting head 32 is recognized.

The controller 9 controls the head unit 3 to start moving to mount the component E on the substrate 100 at a mounting point Pm after the recognition of the component E by the component recognition camera 6 (S30). Specifically, the controller 9 controls the head unit 3 to start moving from the point above the component recognition camera 6 to a point above the substrate 100.

Figure 6:
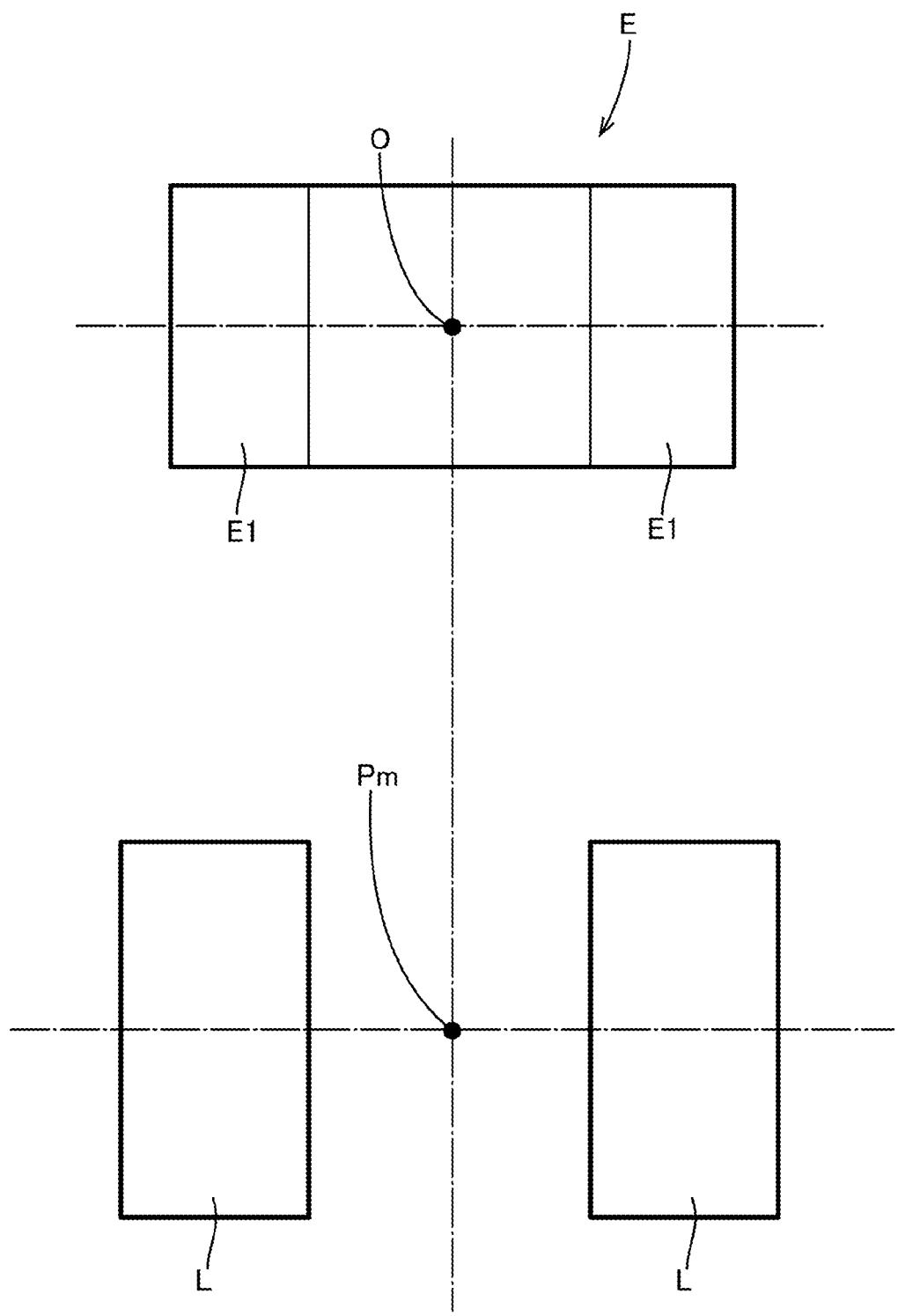
FIG. 6 is an explanatory view illustrating a mounting point at which the component is mounted.

The mounting point Pm is a point at which the component E is mounted on the substrate 100. The component E is mounted such that the center O of the component E corresponds with the mounting point Pm. As illustrated in FIG. 6, the mounting point Pm of the component E is the middle between two lands L that correspond with electrodes E1 if the components E is a chip type component including the electrodes E1.

The controller 9 controls the measurement cameras 81A and 81B corresponding to the mounting head 32 to capture a relevant area M including the mounting point Pm at which the component E is mounted after the head unit 3 is moved and the component E held by the mounting head 32 is moved closer to the mounting point Pm (S40).

Figure 8:
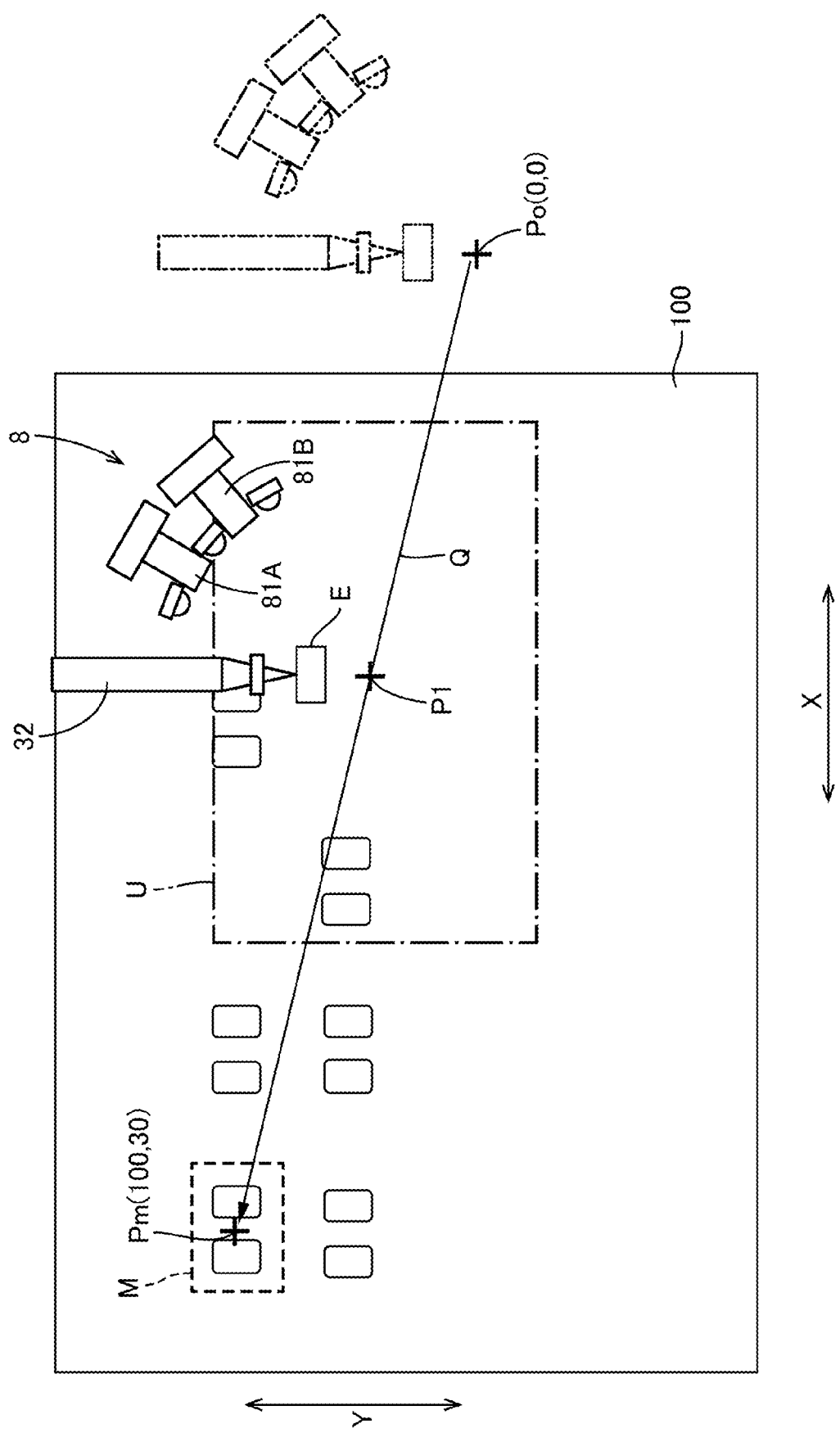
FIG. 8 is a schematic view illustrating a travel path to the mounting point.

The embodiment will be described in more detail with reference to FIG. 8. FIG. 8 is a view schematically illustrating a travel path of the component E from a start point Po to the mounting point Pm. In this embodiment, the start point Po is immediately above the component recognition camera 6 and the component image capturing is performed at the start point Po by the component recognition camera 6.

The start point Po and the mounting point Pm are connected by a straight line that is a path Q corresponding to the travel path of the mounting head 32. In this embodiment, the start point Po is defined at an origin (0, 0) and the mounting point is defined at X and Y coordinates (100, 30). The X and Y coordinates of the mounting point Pm may be obtained by referring to the mounting program for mounting the component E on the substrate 100.

A bordering rectangle in FIG. 8 defines an image capturing area U of the measurement cameras 81A and 81B provide for the mounting head 32. The measurement cameras 81A and 81B are movable together with the head unit 3 and thus the image capturing area U moves along with the head unit 3 along the travel path Q.

FIG. 8 illustrates the image capturing area U when the mounting head 32 is moved to a passing point P1. A location of the mounting head 32 in the travel path Q after moved from the start point Po can be calculated from a travel distance of the mounting head 32. Specifically, the number of revolutions of the X-axis motor 42 and the number of revolutions of the Y-axis motor 53 after the start of moving may be detected by sensors that detect the number of revolutions such as encoders.

After the head unit 3 starts moving, the controller 9 determines whether a relevant area M including the mounting point Pm at which the sucked and held component E is to be mounted is included in the image capturing area U of the measurement cameras 81A and 81B. The relevant area M includes at least information on the lands L corresponding to the mounting point Pm. Specifically, in FIGS. 9 and 10, the relevant area M includes at least information on the lands L1 and L2 disposed on sides of the mounting point Pm.

As illustrated in FIG. 8, when the mounting head 32 is moved to the passing point P1 on the travel path Q after the start of moving, it is determined that the mounting point Pm of the component E sucked and held by the mounting head 32 is located outside the image capturing area U and thus not included in the image capturing area U. The determination is made based on data including a distance between the current point P1 and the goal point Pm, a section of the relevant area M, and a section of the image capturing region U.

When the mounting head 32 is moved closer to the mounting point Pm, the mounting point Pm of the component E sucked and held by the mounting head 32 and the relevant area M are located inside the image capturing region U.

If the controller 9 determines that the relevant area M is within the image capturing region U, an image of the relevant area M including the mounting point Pm of the component E sucked and held by the mounting head 32 is captured by the measurement cameras 81A and 81B.

Figure 9:
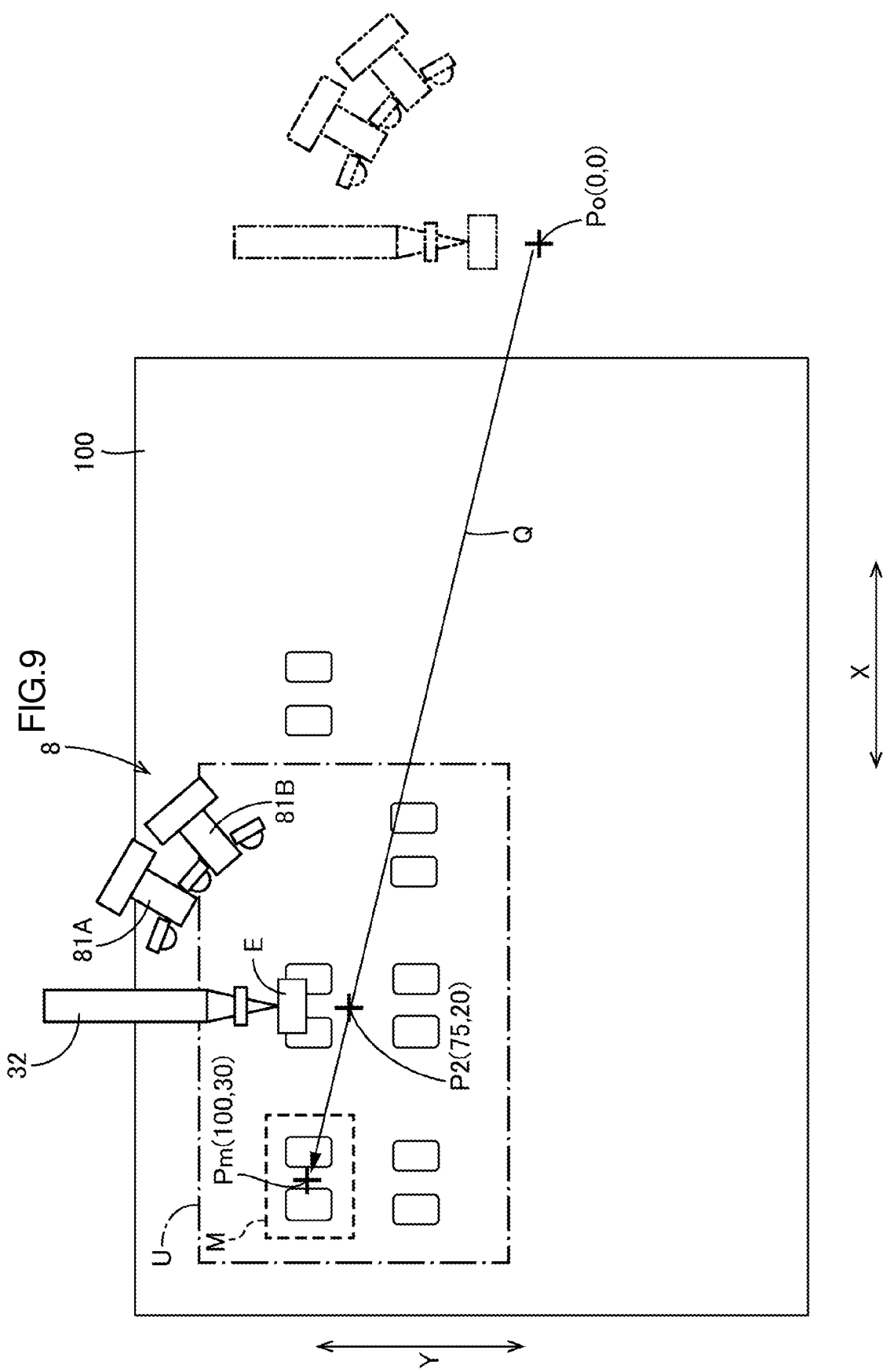
FIG. 9 is a schematic view illustrating a travel path to the mounting point.

In FIG. 9, an image of the relevant area M including the mounting point Pm is captured when the mounting head 32 is moved to a passing point P2 on the travel path Q after the start of moving. Coordinates of the passing point P2 are (75, 20).

The controller 9 performs steps (1) to (3) below for calculating a correction amount W of the mounting point Pm from the captured image (S50).

Figure 7:
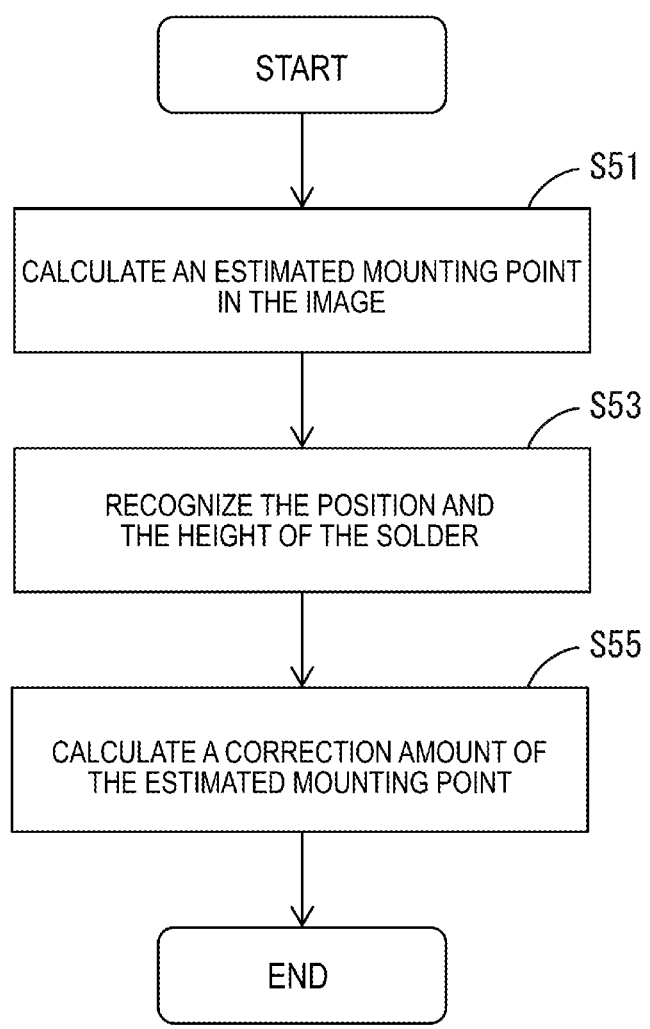
FIG. 7 is a flowchart illustrating a process of calculating a correction amount at the mounting point in detail.

(1) Calculate an estimated mounting point Pv in the image (FIG. 7, S51);

(2) Recognize locations and heights of the solders (FIG. 7, S53); and (3) Calculate the correction amount W of the mounting point Pm from results of the recognition of the locations and the heights of the solders (S55).

The measurement cameras 81A and 81B in the image capture unit 8 are included in an optical system in which the mounting point Pm is located at the center of the image when the image is captured with the mounting head 32 immediately above the mounting point Pm.

As described earlier, the image capturing by the measurement cameras 81A and 81B is performed before the mounting head 32 is moved to the mounting point Pm. Therefore, the estimated mounting point Pv in the image is not located at the center Pc of the image and deviated from the center Pc by a difference between coordinates of the points Pm and P2. The point P2 is the passing point and the point Pm is the mounting point.

The controller 9 can calculate the estimated mounting point Pv in the image from differences ΔX and ΔY in the X-axis direction and the Y-axis direction between the points Pm and P2 (S51). Specifically, in FIG. 9, the difference ΔX in the X-axis direction between the two points Pm and P2 is 20 and the difference ΔY in the Y-axis direction between the two points Pm and P2 is 10. Therefore, a point deviated from the center Pc by 20 in the X-axis direction and 10 in the Y-axis direction is estimated as the estimated mounting point Pv.

Figure 10:
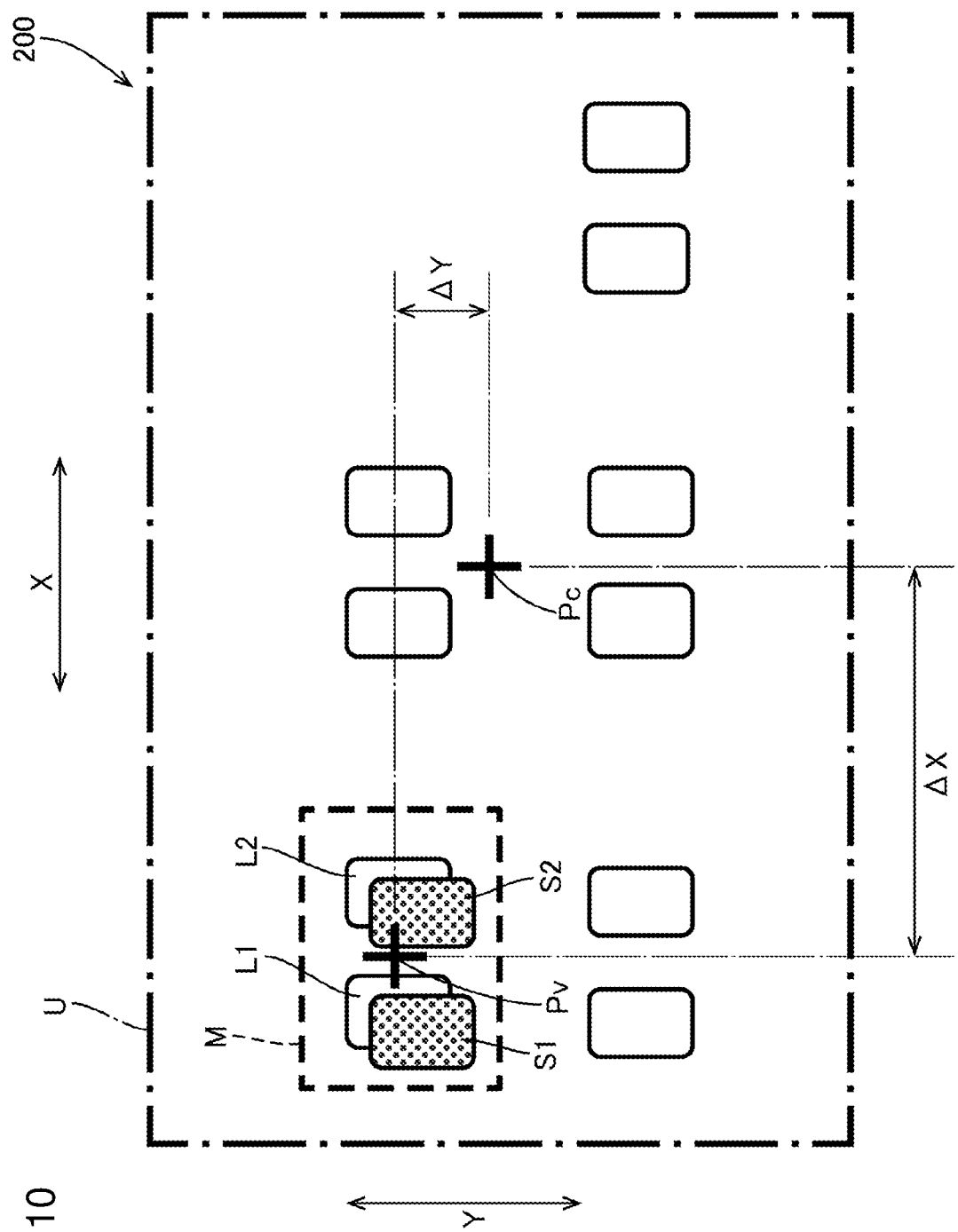
FIG. 10 is a view illustrating an image of a relevant area including the mounting point.

FIG. 10 illustrates an image 200 captured by the measurement cameras 81A and 81B, that is, the image 200 of the relevant area M including the mounting point Pm. Pc indicates the center of the image and Pv indicates the estimated mounting point.

The controller 9 recognizes a location and a height H of the solder S applied to the land corresponding to the estimated mounting point Pv from the captured image 200 (S53).

Figure 11:
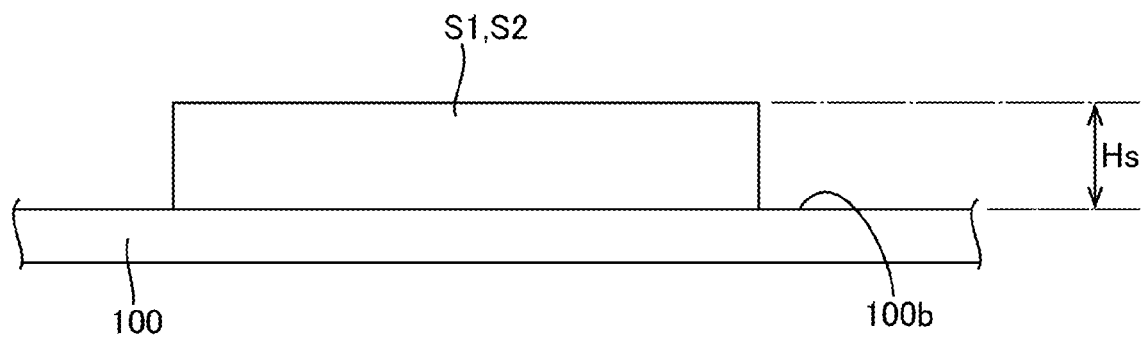
FIG. 11 is a side view illustrating the substrate and a solder.

In FIG. 10, the lands L1 and L2 correspond to the estimated mounting point Pv. The locations of the solders and S2 applied to the respective lands L1 and L2 are recognized. The height Hs of the solders S1 and S2 relative to the top plate surface 100b of the substrate 100 (the substrate top surface) is recognized from the captured image 200 as illustrated in FIG. 11.

The controller 9 calculates the correction amount W at the mounting point Pm from the results of the recognition of the locations and the height Hz of the solders S1 and S2 (S55).

The correction amount W includes a X-axis correction value Wx, a Y-axis correction value Wy, and a Z-axis (height) correction value Wz.

Figure 12:
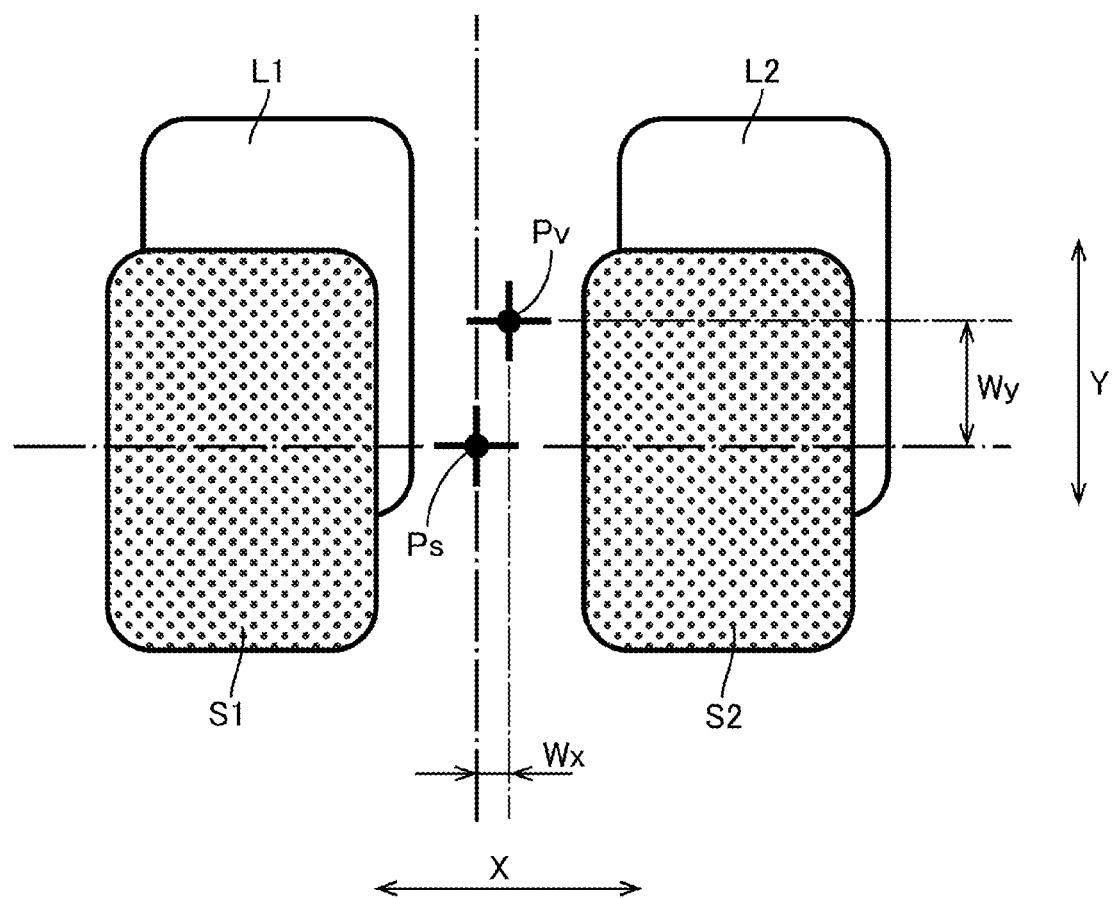
FIG. 12 is a plan view illustrating a pattern and solders.

As illustrated in FIG. 12, the X-axis correction value Wx and the Y-axis correction value Wy can be obtained from the midpoint Ps between the solders S1 and S2 and the estimated mounting point Pv. A difference between an X coordinate of the midpoint Ps between the solders S1 and S2 and an X coordinate of the estimated mounting point Pv is the X-axis correction value Wx. A difference between a Y coordinate of the midpoint Ps between the solders S1 and S2 and a Y coordinate of the estimated mounting point Pv is the Y-axis correction value Wy.

The Z-axis correction value Wz in the height direction is a difference between the height Hs of the solders S1 and S2 determined from the image and a reference height Ho (Ho−Hs). The reference height Ho is an ideal height. If the height of the solder S1 is different from the height of the solder S2, an average of the heights is used for the height Hs.

The controller 9 controls the image capture unit 8 to capture an image of the relevant area M including the mounting point Pm when the mounting head 32 is moving in the travel path Q. The controller 9 calculates the correction amount W while the mounting head 32 is moving from the passing point P2 at which the image is captured to the mounting point Pm.

The controller 9 corrects the mounting point Pm based on the calculated correction amount W to mount the component E on the substrate 100 at the corrected mounting point Pm (S60). Specifically, the controller 9 corrects the X coordinate Pmx of the mounting point Pm using equation (4) and the Y coordinate Pmy of the mounting point Pm using equation (5).

$$Pmx = Px0 \pm Wx \qquad (4)$$

$$Pmy = Py0 \pm Wy \qquad (5)$$

where Px0 is an X coordinate of the mounting point Pm and Py0 is a Y coordinate of the mounting point Pm before the correction.

Figure 13:
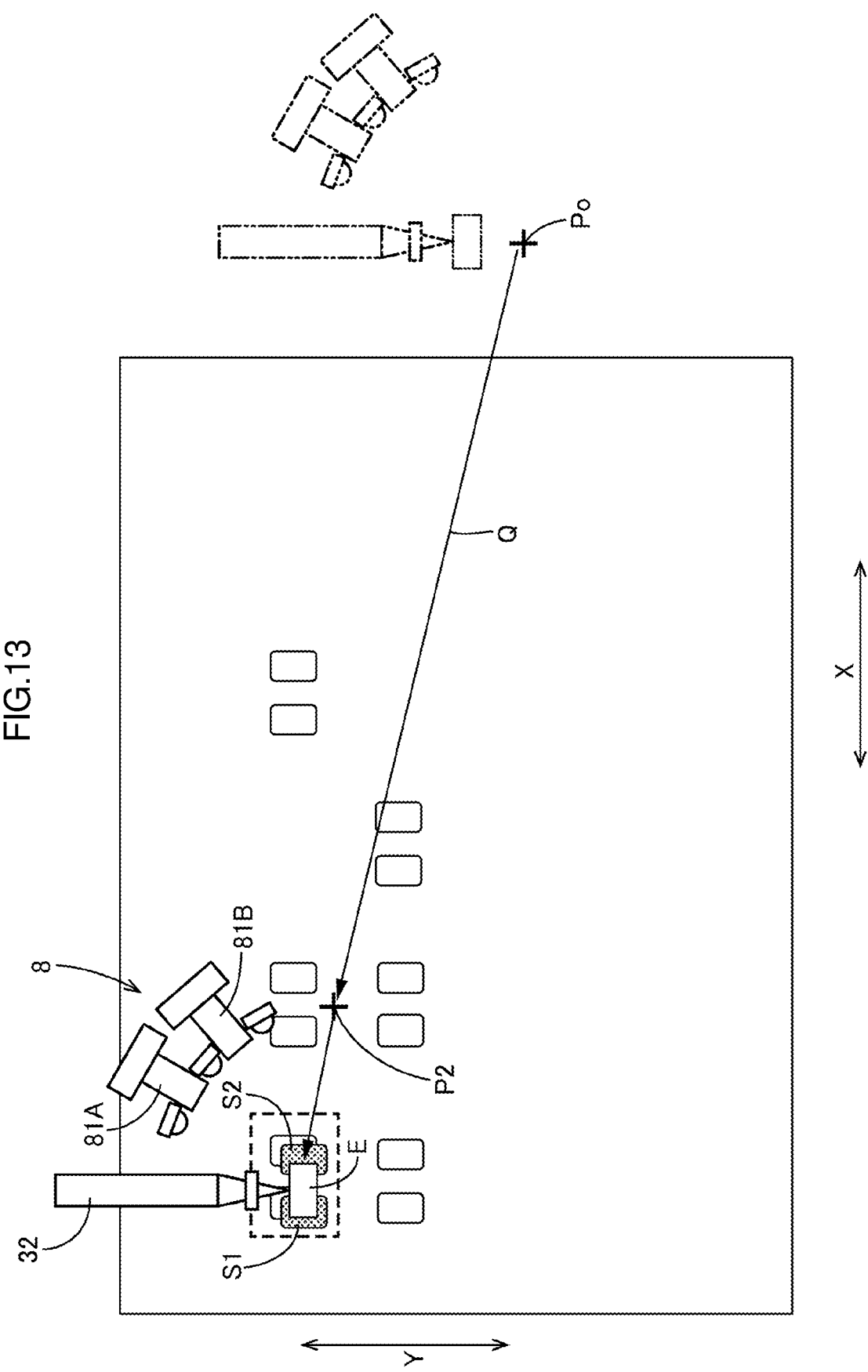
FIG. 13 is a schematic view illustrating a travel path to the mounting point.

According to the configuration, as illustrated in FIGS. 12 and 13, the component E can be mounted with the center O of the component E corresponding with the midpoint Ps between the solders S1 and S2.

Figure 14:
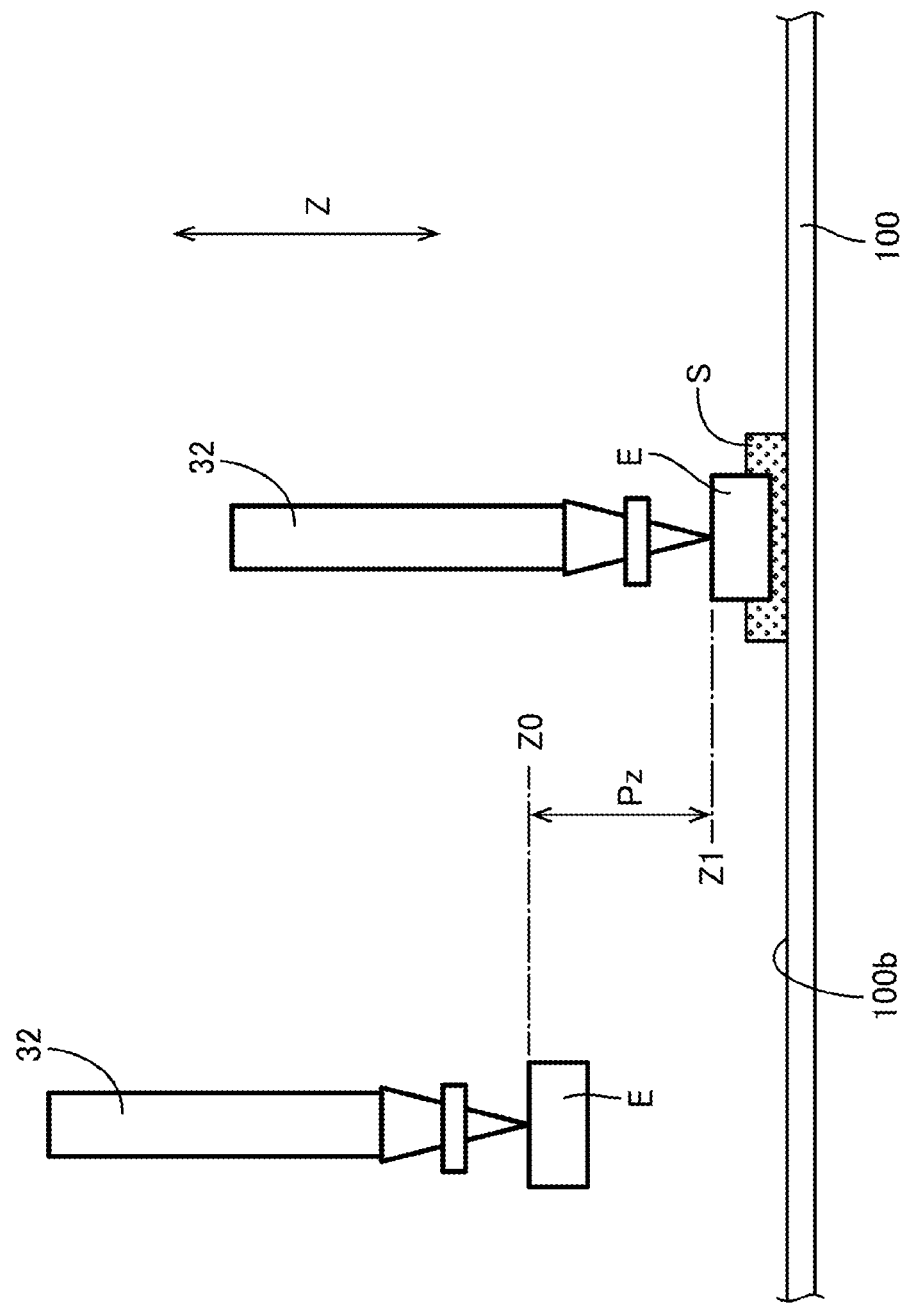
FIG. 14 is a view illustrating lowering of the component.

The controller 9 corrects a lowering amount Pz to lower the mounting head 32 for mounting the component E on the substrate 100 based on the correction value Wz. During the transfer of the component E, the mounting head 32 is at a raised position Z0 that is a predefined distance from the top plate surface 100b. As illustrated in FIG. 14, the mounting head 32 is lowered from the raised position Z0 to a mounting position Z1 to mount the component E on the substrate 100.

$$Pz = Pz0 \pm Wz \qquad (6)$$

where Pz0 is a lowering amount when the solders have the reference height Ho. The lowering amount Pz0 is defined so that the lower surface of the component E contacts the solder S printed on the substrate 100 but not touch the top plate surface 100b.

By correcting the lowering amount Pz of the mounting head 32, the component E can be mounted with an appropriate pushing force to the solder S even if the height of the solder is deviated from the reference height Ho. Namely, the component E can be pushed such that at least the lower surface of the component E contacts the solder S printed on the substrate 100 but not touch the top plate surface 100b.

As described above, in the component mounting device 1, the image of the solder S printed on the substrate 100 is captured by the measurement cameras 81A and 81B in the image capture unit 8 and the mounting point at which the component E is to be mounted is corrected. Therefore, accuracy in mounting of the component E can be improved. Furthermore, the measurement cameras 81A and 81B are the stereo cameras and configured to measure not only the X-axis position and the Y-axis position of the solder S but also the height Hs from the substrate top surface from the image of the relevant area M including the mounting point Pm. The mounting point Pm and the lowering amount Pz of the mounting head 32 are corrected for mounting the component E on the substrate 100. Regardless of the height of the solder S printed on the substrate 100, the component E can be mounted on the substrate 100 with the appropriate pushing force.

In the component mounting device 1, the capturing the image of the relevant area M including the mounting point Pm is performed when the mounting head 32 is moving toward the mounting point Pm and before the component E reaches the mounting point Pm. In comparison to a configuration in which the image capturing is performed after the component E reaches the mounting point Pm, downtime can be reduced.

Second Embodiment

Figure 15:
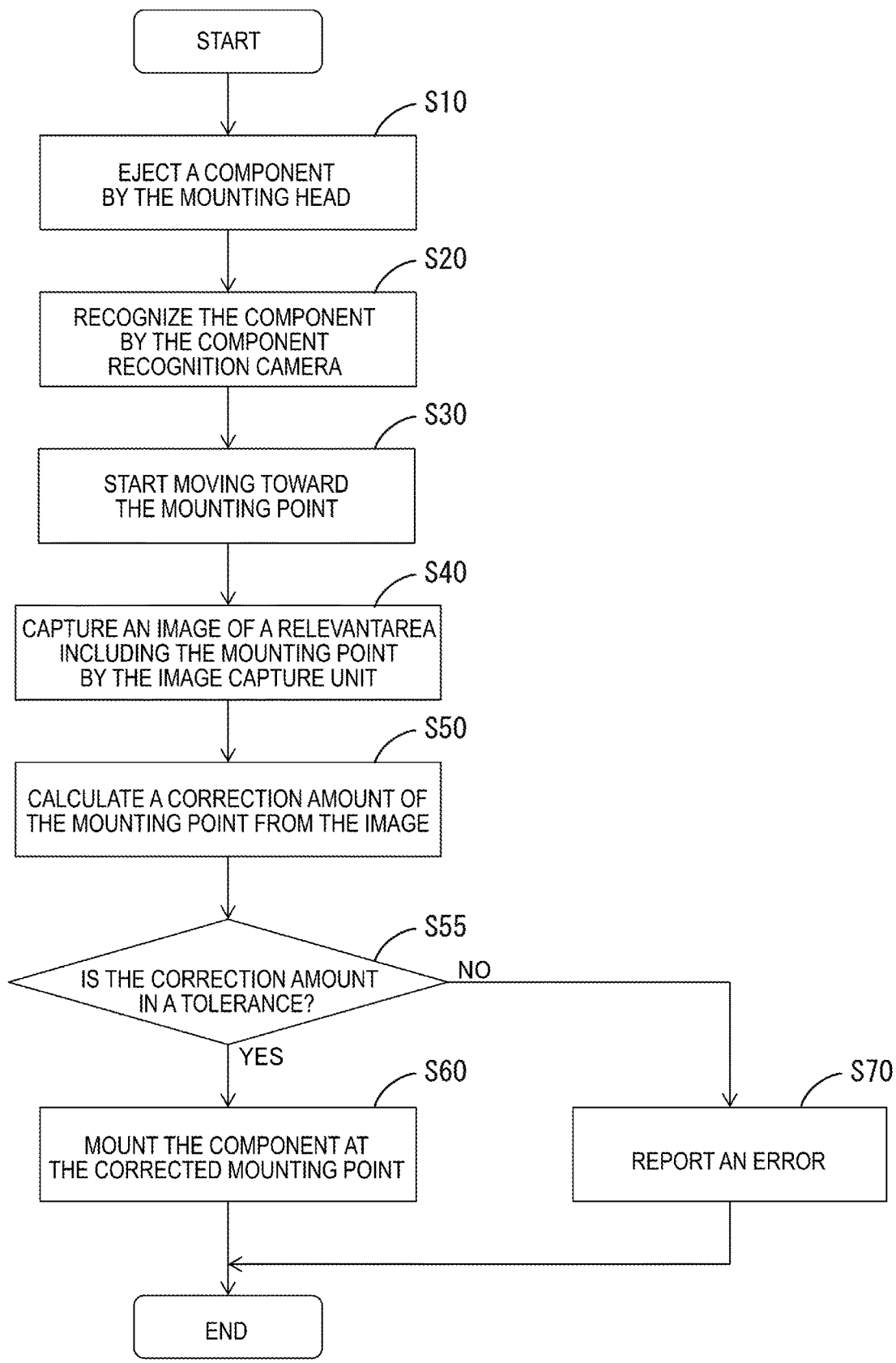
FIG. 15 is a flowchart illustrating a flow of a process of mounting a component according to a second embodiment.

FIG. 15 is a flowchart illustrating a mounting process according to the second embodiment. The second embodiment includes steps S55 and S70 in addition to the first embodiment. Other steps (S10 to S50 and S60) are the same as the first embodiment and thus will not be described.

Figure 16:
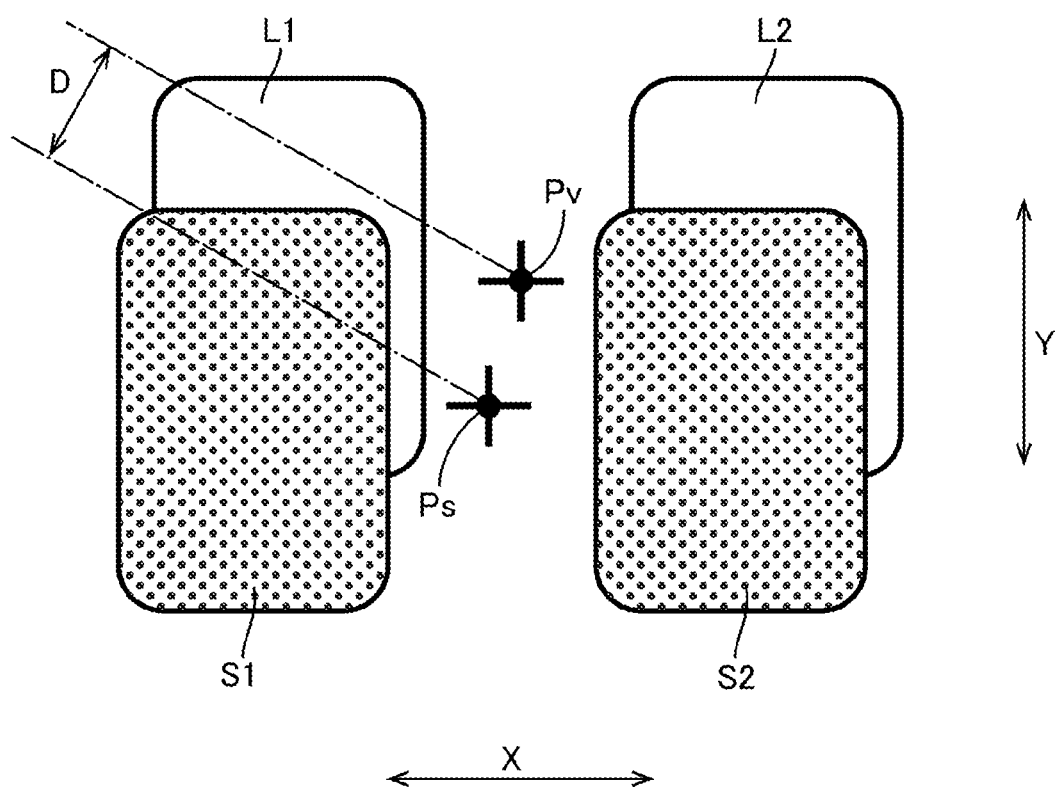
FIG. 16 is a plan view illustrating a pattern and solders.

After the correction amount W of the mounting point Pm is calculated in step S50, the controller 9 determines whether the calculate correction amount W is within a tolerance in step S55. Specifically, as illustrated in FIG. 16, the controller 9 calculates a distance D between the midpoint Ps between solders S1 and S2 and an estimated mounting point Pv and determines whether the calculated distance is within the tolerance.

If the distance D is within the tolerance, the controller 9 corrects the mounting point Pm and mounts the components E. The process is similar to the first embodiment.

If the distance D is out of the tolerance, the controller 9 reports an error. Specifically, an error message is displayed on a display 54. If the location of the solder S printed on the substrate 100 is not correct, the production may be immediately stopped to reduce defects. In this configuration, the error is reported when a shift in location of the solder S is detected. However, the error may be reported when the height of the solder S is detected.

Third Embodiment

The measurement cameras 81A and 81B in the image capture unit 8 capture an image of an object at angles. According to a vertical position of the mounting head 32 or a size of the component E held by the mounting head 32, the end of the mounting head 32 or the component E may in a field of view of the measurement camera 81A or 81B.

Figure 17:
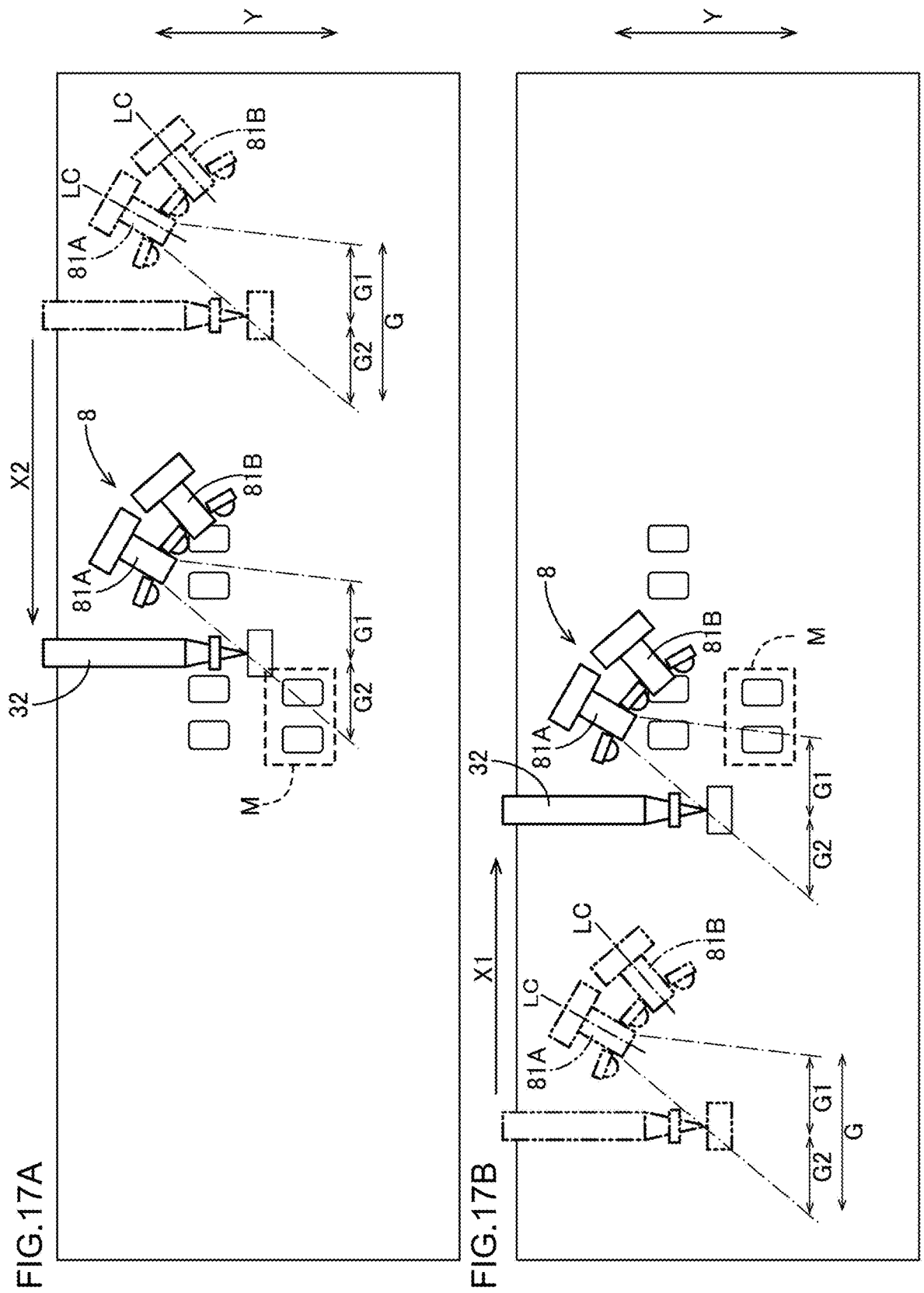
FIGS. 17A and 17B are explanatory views illustrating a travel direction of an image capture unit.
Figure 18:
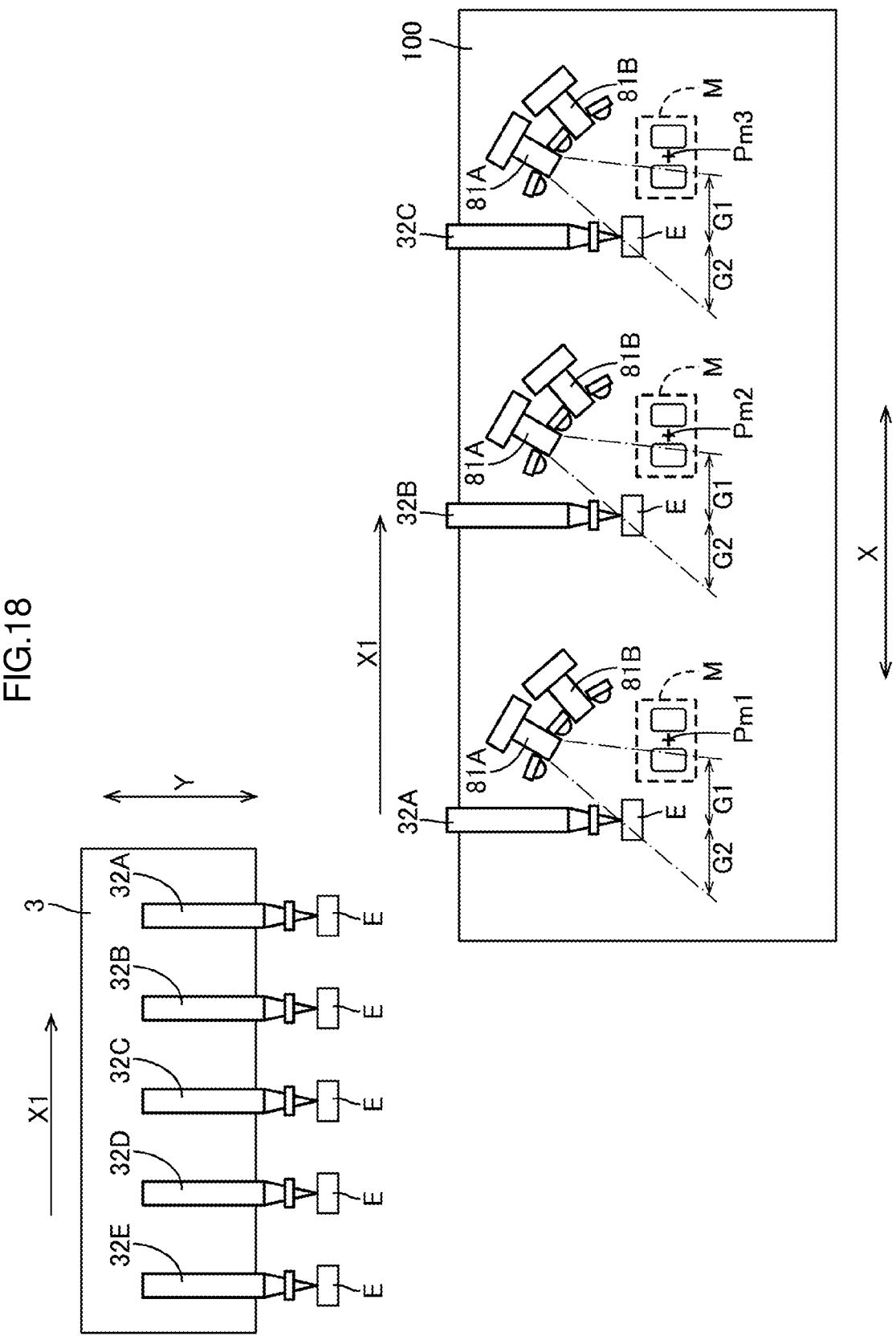
FIG. 18 is an explanatory view illustrating a component mounting sequence.

In FIG. 17A, the measurement cameras 81A and 81B are on the right side relative to the mounting head 32. Camera optical axes are tilted toward the lower left. The component E held at a lower portion of the mounting head 32 is in a left section of the field of view G of the measurement camera 81A or 81B. FIG. 17A illustrates the component E in the field of view G of the measurement camera 81A.

As illustrated in FIG. 17A, to capture an image of the relevant area M including the mounting point Pm when the mounting head 32 and the image capture unit 32 are moving the X2 direction, an area G2 of the field of view G in which the component E is present overlaps the relevant area M first. Namely, the relevant area M cannot be captured before the area G2 passes the relevant area M. This may cause a loss of time.

To capture the image of the relevant area M including the mounting point Pm to correct the mounting point Pm at which the component E is to be mounted before the mounting of the component E, it is preferable to move the head unit 3 such that an area G1 of the field of view of the measurement camera 81A or 81B in the image capture unit 8 overlap the relevant area M including the mounting point Pm first and to perform image capturing.

Specifically, as illustrated in FIG. 17B, the image of the relevant area M including the mounting point Pm is captured when the mounting head 32 and the image capture unit 32 are moving in the X-axis direction. According to the configuration, the area G1 of the field of view G in which the component E is not present overlaps the target relevant area M before the area G2 in which the component E is present overlaps the target relevant area M. Therefore, the image of the target relevant area M can be captured at the time when the target relevant area M overlaps the field of view G, that is, the image of the target relevant area M can be captured without a loss of time.

The head unit 3 includes the mounting heads 32 holding the components E at the same time. After the first component E is mounted at the first mounting point Pm, the second component E is moved to the second mounting point Pm. It is preferable that a sequence of mounting the components E is define such that the area G1 of the field of view of the measurement camera 81A or 81B in which the component E is not present overlaps the relevant area M including the next mounting point Pm overlaps the area G1 in which the component E is not present first.

Specifically, if the mounting points Pm1 to Pm3 are linearly arranged in the X-axis direction, the sequence of mounting the components E may be defined as Pm1, Pm2, and Pm3 to mount the components E in the X1 direction.

In this case, the image capturing and the mounting are performed as follows while moving the head unit 3 in the X1 direction. The image of the relevant area M including the first mounting point Pm1 is captured by the measurement cameras 81A and 81B provided for a first mounting head 32A and the component E held by the first mounting head 32A is mounted at the first mounting point Pm1. Then, the image of the relevant area M including the second mounting point Pm2 is captured by the measurement cameras 81A and 81B provided for a second mounting head 32B and the component E held by the second mounting head 32B is mounted at the second mounting point Pm2. Then, the image of the relevant area M including the third mounting point Pm3 is captured by the measurement cameras 81A and 81B provided for a third mounting head 32C and the component E held by the third mounting head 32C is mounted at the third mounting point Pm3.

According to the configuration, the area G1 of the field of view G in which the component E is not present overlaps the target relevant area M prior to the area G2 in which the component E is present. Therefore, the image of the relevant area M can be captured at the time when the relevant area M overlaps the field of view without a loss of time.

The embodiments have been described in detail. The embodiments are only examples and do not limit the scope of claims. The technical scope of claims includes modification of the above embodiments.

(1) In the first embodiment, two measurement cameras 81A and 81B that capture images of objects at angles are included in the stereo cameras. However, any cameras that can capture three-dimensional images of objects may be used for the stereo cameras. The cameras may not be capture images at angles.

(2) In the first embodiment, the point immediately above the component recognition camera 6 is defined as the start point Po. However, any point other than the point immediately above the component recognition camera 6 may be defined as the start point Po as long as X and Y coordinates of the point are recognizable on the stage.

The invention claimed is:

1. A method of determining a mounting sequence in a component mounting device including a head unit including mounting heads and stereo cameras, the method comprising:
   providing a plurality of mounting heads wherein each of the mounting heads includes at least one stereo camera disposed thereon and configured to capture a three-dimensional image of a component;
   providing a driver configured to move each of the mounting heads on a stage;
   providing a controller configured to:
      capture an image of a relevant area including a mounting point on the substrate by the stereo camera before the component reaches the mounting point during transfer of the component held by the each of the mounting heads to the mounting point;
      calculate a correction amount with respect to an X-axis direction, a Y-axis direction, and a Z-axis direction based on three-dimensional information on the relevant area with respect to the X-axis direction, the Y-axis direction, and the Z-axis direction obtained through capturing of the image to mount the component on the mounting point; and
      determine the mounting sequence of mounting components so that the components are held by the mounting heads in the head unit at a same time, such that when one of the components is mounted at a mounting point, a section of a field of view of each of the stereo cameras in which the one of the components is not present overlaps a relevant area including a next mounting point during transfer of a next one of the components to the next mounting point.

2. A component mounting device for mounting a component on a substrate, the component mounting device comprising:
   a head unit including a mounting head configured to hold the component and a stereo camera configured to capture a three-dimensional image of an object;
   a driver configured to move the head unit on a stage; and
   a controller configured to:
      capture an image of a relevant area including a mounting point on the substrate by the stereo camera before the component reaches the mounting point during a transfer of the component held by the mounting head to the mounting point;
      calculate a correction amount including a first correction value with respect to an X-axis direction, a second correction value with respect to a Y-axis direction, and a third correction value with respect to a Z-axis direction based on three-dimensional information on the relevant area with respect to the X-axis direction, the Y-axis direction, and the Z-axis direction obtained through capturing of the image to mount the component on solders on lands corresponding to the mounting point;

calculate an estimated mounting point in the image of the relevant area based on a difference between the coordinates of the mounting point and the coordinates of the passing point;

calculate the first correction value and the second correction value based on a middle point between solders recognized in the image of the relevant area and the estimated mounting point;

calculate the third correction value based on a height of the solders recognized in the image of the relevant area; and correct the mounting point of the component based on the correction amount to mount the component on the substrate.

3. The component mounting device according to claim 2, wherein the controller is configured to perform error processing if the correction amount including the first correction value, the second correction value, and the third correction value is out of a tolerance.

4. A component mounting device for mounting a component on a substrate including solders disposed in a relevant area including a mounting point that is at a middle between the solders and at which the component is mounted, the component mounting device comprising:

a head unit including a mounting head to hold the component and a stereo camera to capture three-dimensional images in an image capturing region of the stereo camera;

a driver being connected to the head unit and moving the head unit on a stage to transfer the mounting head to the mounting point and to lower the mounting head to a mounting position; and a controller including a memory storing a mounting program to control the driver, the controller being configured to:

refer the mounting program to obtain coordinates of the mounting point;

determine coordinates of a passing point of the head unit before the mounting head reaches the mounting point during transfer of the mounting head;

determine a distance between the mounting point and the passing point defined by the coordinates of the mounting point and the coordinates of the passing point before the mounting head reaches the mounting point during the transfer of the mounting head;

determine whether the relevant area is within the image capturing region before the mounting head reaches the mounting point during the transfer of the mounting head based on at least the distance;

when the relevant area is within the image capturing region, control the stereo camera to capture an image of the relevant area before the mounting head reaches the mounting point during the transfer of the mounting head;

calculate an estimated mounting point in the image of the relevant area based on the coordinates of the mounting point and the coordinates of the passing point before the mounting head reaches the mounting point during the transfer of the mounting head;

recognize locations and a height of the solders in the image of the relevant area before the mounting head reaches the mounting point during the transfer of the mounting head;

calculate a first correction value with respect to an X-axis direction and a second correction value with respect to a Y-axis direction based on a middle point between the solders in the image of the relevant area and the estimated mounting point before the mounting head reaches the mounting point during the transfer of the mounting head;

correct the mounting point based on the first correction value and the second correction value before the mounting head reaches the mounting point during the transfer of the mounting head;

calculate a third correction value based on the height of the solders before the mounting head reaches the mounting point during the transfer of the mounting head;

correct the mounting position of the mounting head based on the third correction value before the mounting head reaches the mounting point during the transfer of the mounting head; and control the driver to transfer the mounting head to the mounting point that is corrected and lower the mounting head to the mounting position that is corrected to mount the component on the substate at the mounting point that is corrected.

5. The component mounting device according to claim 4, wherein the controller is configured to alert when at least one of the first correction value, the second correction value, and the third correction value is out of tolerance.

6. The component mounting device according to claim 4, wherein the memory further contains data including the relevant area and the image capturing region, and the controller determines whether the relevant area is within the image capturing region based on the distance and the data.

7. The component mounting device according to claim 4, further comprising:

a first ball screw extending in the X-axis direction;

a second ball screw extending in the Y-axis direction; and a support coupled to the first ball screw and the second ball screw, wherein the driver includes an X-axis motor and a Y-axis motor, the X-axis motor is coupled to the first ball screw to move the support in the X-axis direction, the Y-axis motor is coupled to the second ball screw to move the support in the Y-axis direction, the head unit is coupled to the first ball screw, the controller is electrically connected to the X-axis motor and the Y-axis motor, and the controller determines the coordinates of the passing point of the head unit based on a number of revolutions of the X-axis motor and a number of revolutions of the Y-axis motor.

8. The component mounting device according to claim 7, wherein the controller calculates differences between the coordinates of the mounting point and the coordinates of the passing point, and the controller calculates the estimated mounting point based on the differences.

* * * * *